US011678559B2

(12) United States Patent
Moon et al.

(10) Patent No.: US 11,678,559 B2
(45) Date of Patent: Jun. 13, 2023

(54) MASK ASSEMBLY AND METHOD OF MANUFACTURING MASK ASSEMBLY OF DISPLAY DEVICE HAVING FIRST AND SECOND MASKS WITH A SUPPORT COUPLED TO THE SECOND MASK

(71) Applicant: Samsung Display Co., Ltd., Yongin-si (KR)

(72) Inventors: Minho Moon, Yongin-si (KR); Jinoh Kwag, Yongin-si (KR); Inbae Kim, Yongin-si (KR); Seungyong Song, Yongin-si (KR); Duckjung Lee, Yongin-si (KR); Hyeyong Chu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 163 days.

(21) Appl. No.: 17/030,372

(22) Filed: Sep. 24, 2020

(65) Prior Publication Data

US 2021/0265599 A1 Aug. 26, 2021

(30) Foreign Application Priority Data

Feb. 21, 2020 (KR) ........................ 10-2020-0021769

(51) Int. Cl.
| | |
|---|---|
| *H10K 71/00* | (2023.01) |
| *H10K 71/16* | (2023.01) |
| *C23C 14/04* | (2006.01) |
| *H01L 51/56* | (2006.01) |
| *H01L 51/00* | (2006.01) |

(52) U.S. Cl.
CPC .......... *H01L 51/56* (2013.01); *H01L 51/0011* (2013.01); *C23C 14/042* (2013.01)

(58) Field of Classification Search
CPC ...................................................... H01L 51/56
See application file for complete search history.

(56) References Cited

U.S. PATENT DOCUMENTS

| | | | |
|---|---|---|---|
| 6,063,434 A * | 5/2000 | Rho ........................ | H01J 9/142 106/287.19 |
| 7,802,537 B2 * | 9/2010 | Kang .................... | C23C 14/042 118/504 |
| 10,533,246 B2 | 1/2020 | Mizumura et al. | |

(Continued)

FOREIGN PATENT DOCUMENTS

| | | |
|---|---|---|
| JP | 2003-110124 | 4/2003 |
| KR | 10-2016-0145607 | 12/2016 |

(Continued)

*Primary Examiner* — Caleb E Henry
(74) *Attorney, Agent, or Firm* — H.C. Park & Associates, PLC

(57) ABSTRACT

An apparatus for manufacturing a display device includes: a mask assembly, wherein the mask assembly includes: a mask frame including an open area; a first mask disposed on the mask frame, the first mask including at least one opening; a second mask disposed on the first mask, the second mask including a mesh portion having a mesh shape and a blocking member to shield a portion of the mesh portion; and a first support supporting a display substrate on the second mask and separating the display substrate from the second mask, wherein the blocking member overlaps the opening.

8 Claims, 15 Drawing Sheets

(56) References Cited

U.S. PATENT DOCUMENTS

| | | | |
|---|---|---|---|
| 2003/0101932 A1* | 6/2003 | Kang | H01L 51/56 |
| | | | 118/504 |
| 2003/0221614 A1* | 12/2003 | Kang | C23C 14/042 |
| | | | 118/504 |
| 2014/0165863 A1* | 6/2014 | Han | B41F 15/18 |
| | | | 101/126 |
| 2016/0301036 A1* | 10/2016 | Han | C23C 14/04 |
| 2017/0036230 A1 | 2/2017 | Mizumura | |
| 2017/0098800 A1* | 4/2017 | Kim | H01L 51/0004 |
| 2017/0222145 A1* | 8/2017 | Kim | B05C 21/005 |
| 2017/0250208 A1* | 8/2017 | Kim | B05C 21/005 |
| 2017/0268093 A1* | 9/2017 | Ji | C23C 14/042 |
| 2018/0023183 A1* | 1/2018 | Kang | C23C 14/042 |
| | | | 118/720 |
| 2018/0083192 A1* | 3/2018 | Jeong | H01L 21/67 |
| 2018/0209029 A1* | 7/2018 | Lin | C23C 14/042 |
| 2018/0239241 A1* | 8/2018 | Lv | B05C 21/005 |
| 2019/0062894 A1* | 2/2019 | Yang | C23C 14/24 |

FOREIGN PATENT DOCUMENTS

| | | |
|---|---|---|
| KR | 10-2017-0028311 | 3/2017 |
| KR | 10-2018-0047594 | 5/2018 |

* cited by examiner

MASK ASSEMBLY AND METHOD OF MANUFACTURING MASK ASSEMBLY OF DISPLAY DEVICE HAVING FIRST AND SECOND MASKS WITH A SUPPORT COUPLED TO THE SECOND MASK

CROSS-REFERENCE TO RELATED APPLICATION

This application claims priority from and the benefit of Korean Patent Application No. 10-2020-0021769, filed on Feb. 21, 2020, which is hereby incorporated by reference for all purposes as if fully set forth herein.

BACKGROUND

Field

Exemplary embodiments of the invention relate generally to display devices and, more particularly, to an apparatus for manufacturing a display device, a method of manufacturing a mask assembly, and a method of manufacturing the display device.

Discussion of the Background

Recently, the use of display devices has diversified. In addition, as the thickness and weight of the display devices have been reduced, their use has expanded.

Various functions for connecting or linking other devices to display devices have been developed along with increasing the display area in such display devices. As a method for adding various functions while increasing the display area, research on a display device having an area for adding various functions as well as an image display inside the display area has been conducted.

An organic light-emitting display device, as an example of a display device, may include a pixel electrode and an opposite electrode. The opposite electrode may be formed in a number of ways, one of which is to deposit a deposition material on a surface. In this deposition method, the opposite electrode may be formed by depositing a deposition material on the entire surface of a substrate by using a common mask. A shield portion provided to shield open spaces in the deposition mask may be used to form certain features like openings for cameras, sensors and the like.

The above information disclosed in this Background section is only for understanding of the background of the inventive concepts, and, therefore, it may contain information that does not constitute prior art.

SUMMARY

Applicant discovered that when the shield portion is fixed by a rib or the like, the deposition material is not deposited on the entire display substrate due to the rib. Therefore, the deposition material has to be re-deposited using another mask assembly and, the process time for depositing the deposition material on the display substrate may increase.

Apparatus for manufacturing a display device constructed according to the principles and exemplary embodiments of the invention, and methods of manufacturing a mask assembly and the display device are capable of providing high transmittance in a transmission area inside a display area. For example, a mesh portion of a mask having a shield portion may be fixed to the mesh portion without any supporting ribs or the like. Thus, uniform deposition over substantially the entire display substrate may be achieved through a single deposition process, and the efficiency of the method of manufacturing a display device may be improved.

Additional features of the inventive concepts will be set forth in the description which follows, and in part will be apparent from the description, or may be learned by practice of the inventive concepts.

According to one aspect of the invention, an apparatus for manufacturing a display device includes: a mask assembly, wherein the mask assembly includes: a mask frame including an open area; a first mask disposed on the mask frame, the first mask including at least one opening; a second mask disposed on the first mask, the second mask including a mesh portion having a mesh shape and a blocking member to shield a portion of the mesh portion; and a first support supporting a display substrate on the second mask and separating the display substrate from the second mask, wherein the blocking member overlaps the opening.

The mask frame may have a thickness greater than a thickness of the first mask or a thickness of the second mask, and the first support may couple the second mask to the mask frame.

The first support, the second mask, and the mask frame may be coupled to one another.

The first support may include a substrate supporter at least partially directly coupled to the mask frame.

The first support may be disposed along the mask frame.

The first support may include a first substrate supporter and a second substrate supporter, wherein the first substrate supporter may be spaced apart from the open area and may be disposed along the mask frame, and the second substrate supporter may intersect the open area.

The mesh portion may include a plurality of first wires extending in a first direction and a plurality of second wires extending in a second direction intersecting the first direction, wherein the plurality of first wires and the plurality of second wires may define a plurality of mesh holes, wherein the blocking member entirely may shield at least one of the plurality of mesh holes.

The blocking member may include a shield portion having a generally circular shape in a plan view.

The apparatus may further include: a chamber in which the mask assembly may be arranged; and a deposition source may be arranged in the chamber, the deposition source configured to supply a deposition material into the chamber, wherein the mask assembly may be oriented to face the deposition source for deposition material to pass thorough the mask assembly to the display substrate.

According to another aspect of the invention, a method of manufacturing a mask assembly for making a display device includes the steps of: fixing a first mask including an opening to a mask frame including an open area; arranging, on the first mask, a second mask including a mesh portion having a mesh shape; coupling a first support on the second mask; and forming a blocking member that shields a portion of the mesh portion.

The mask frame may have a thickness greater than a thickness of the first mask or a thickness of the second mask, wherein the step of coupling the first support may include coupling the first support, the second mask, and the mask frame to one another.

The step of coupling the first support may include coupling the first support, the second mask, and the mask frame by welding.

The first support may include a plurality of substrate supporters, wherein one of the plurality of substrate supporters may intersect the open area.

The blocking member is formed by an electro-forming method.

The blocking member may include a shielding member formed by: forming a photoresist on the second mask; overlapping an exposure mask to the second mask to expose at least a portion of the photoresist; and developing the photoresist.

The exposure mask may include an exposure opening, wherein, when the exposure mask overlaps the second mask, a portion of the photoresist, which may overlap the exposure opening, may be exposed.

According to a further aspect of the invention, a method of manufacturing a display device includes the steps of: arranging a display substrate in a chamber; supplying a deposition material into the chamber from a deposition source in the chamber; and depositing the deposition material on the display substrate by passing the deposition material through a mask assembly arranged to face the deposition source, wherein the mask assembly includes: a mask including a mesh portion having a mesh shape and a blocking portion shielding a portion of the mesh portion; and a first support that supports the display substrate on the mask and separates the display substrate from the mask.

The step of forming an opposite electrode may have an opposite electrode hole on the display substrate.

The opposite electrode hole may be formed between a first pixel and a second pixel spaced apart from each other on the display substrate.

The step of overlapping a component may be with the opposite electrode hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
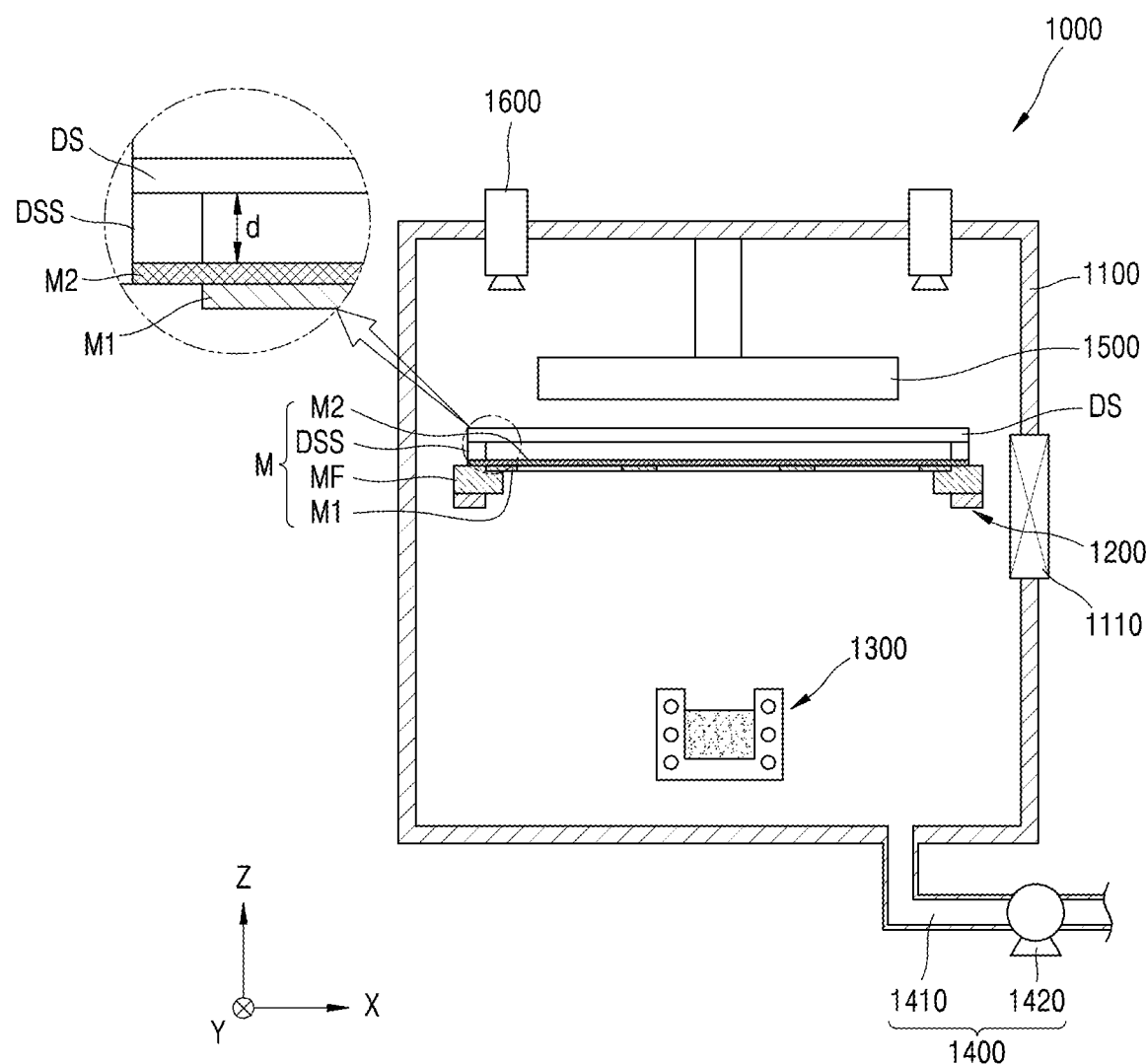
FIG. 1 is a cross-sectional view of an exemplary embodiment of an apparatus for manufacturing a display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements. Those components that are the same or function in substantially the same manner have the same reference numeral regardless of the figure number, and a redundant description therewith is omitted to avoid redundancy.

When an element, such as a layer, region, or component, is referred to as being "on," "connected to," or "coupled to" another element, layer, region, or component, it may be directly on, connected to, or coupled to the other element, layer, region, or component or intervening elements, layers, regions, or components may be present. When, however, an element or layer is referred to as being "directly on,"

"directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
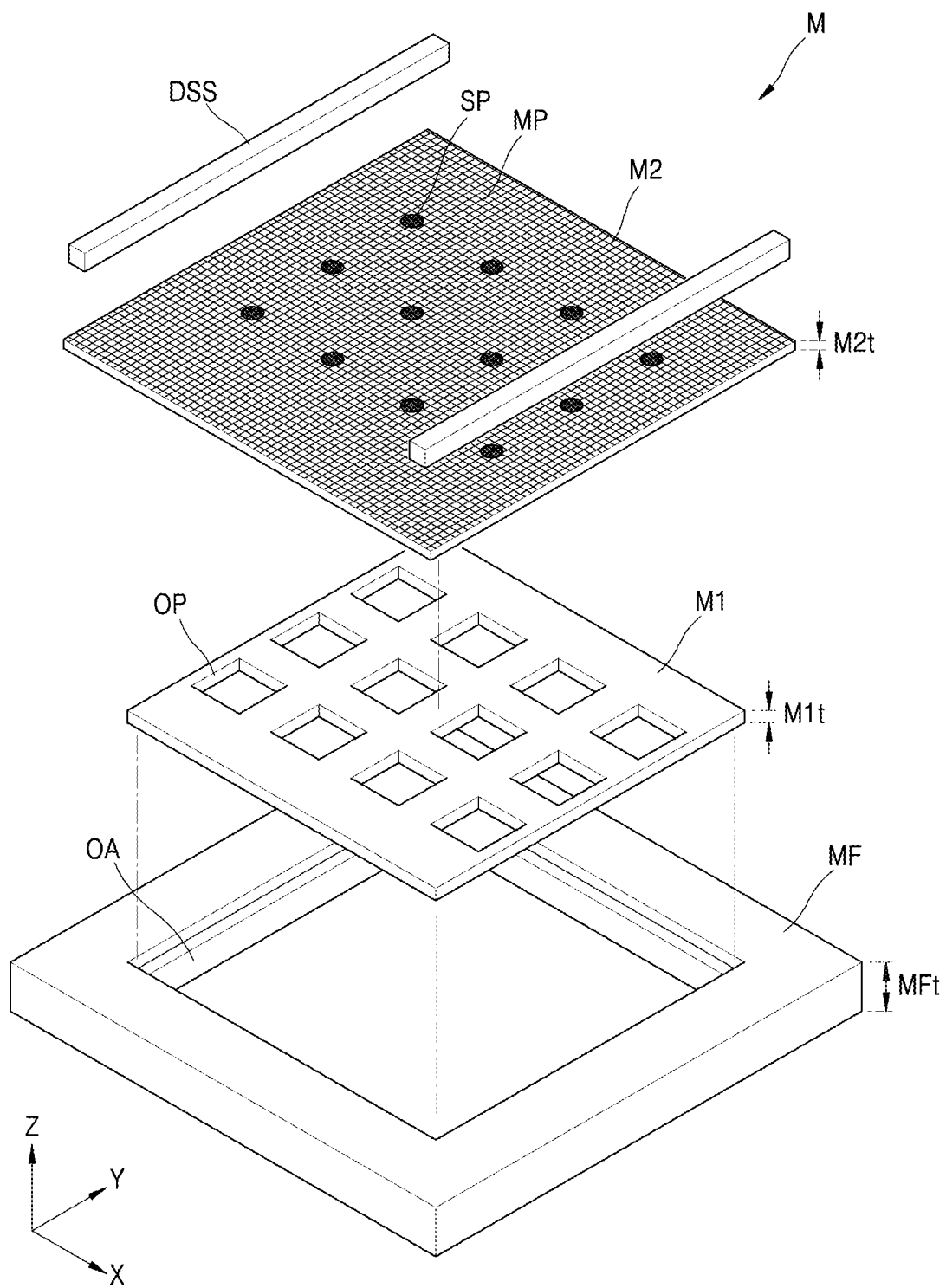
FIG. 2 is an exploded, perspective view of an exemplary embodiment of a mask assembly constructed according to principles of the invention.
Figure 3:
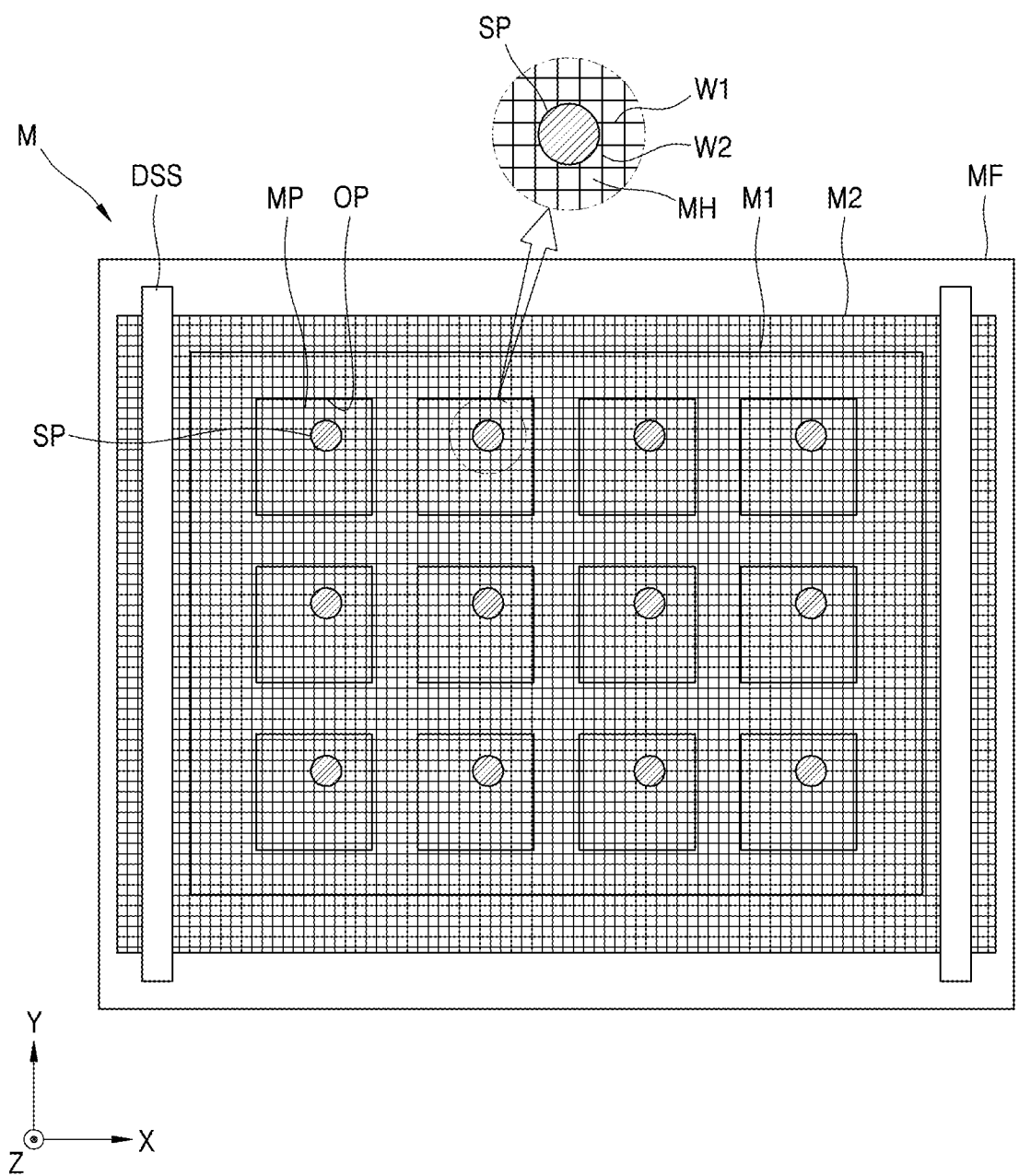
FIG. 3 is a top, plan view of the mask assembly of FIG. 2.

FIG. 1 is a cross-sectional view of an exemplary embodiment of an apparatus for manufacturing a display device constructed according to principles of the invention. FIG. 2 is an exploded, perspective view of an exemplary embodiment of a mask assembly constructed according to principles of the invention. FIG. 3 is a top, plan view of the mask assembly of FIG. 2.

Referring to FIGS. 1 to 3, the apparatus 1000 for manufacturing a display device may include a chamber 1100, a mask supporter 1200, a deposition source 1300, a pressure adjuster 1400, a magnetic force portion 1500, a vision portion 1600, and a mask assembly M.

The chamber 1100 may have a space formed therein, and one side of the chamber 1100 may be opened to allow a display substrate DS to be pulled out or received. An opening and closing portion 1110 including a gate valve and the like may be arranged in a portion of the chamber 1100 to selectively open and close the chamber 1100.

The display substrate DS may be a display device being manufactured. The display substrate DS may include a glass, or a polymer resin such as a polyethersulfone, a polyarylate, a polyetherimide, a polyethylene naphthalate, a polyethylene terephthalate, a polyphenylene sulfide, a polyimide, a polycarbonate (PC), a cellulose tri acetate (TAC), a cellulose acetate propionate, or the like.

The mask assembly M may be mounted on the mask supporter 1200. The mask supporter 1200 may be arranged in the chamber 1100. The mask supporter 1200 may finely adjust the position of the mask assembly M. The mask supporter 1200 may include a driving portion and an alignment portion to move the mask assembly M.

The deposition source 1300 may be arranged to face the mask assembly M. The deposition source 1300 may contain a deposition material and may evaporate or sublimate the deposition material by applying heat to the deposition material. Thus, the deposition source 1300 may supply the evaporation material.

The pressure adjuster 1400 may include a connection pipe 1410 connected to the chamber 1100 and a pump 1420 installed in the connection pipe 1410. Depending on the operation of the pump 1420, external air may be introduced through the connection pipe 1410 or gas inside the chamber 1100 may be guided to the outside through the connection pipe 1410.

The magnetic force portion 1500 may be arranged opposite to the deposition source 1300 based on the mask assembly M. The magnetic force portion 1500 may apply a magnetic force to the mask assembly M to force the mask assembly M toward the display substrate DS. The magnetic force portion 1500 may not only prevent the sagging of the mask assembly M, but may also allow the mask assembly M to be brought close to the display substrate DS. In addition, the magnetic force portion 1500 may uniformly maintain a gap between the mask assembly M and the display substrate DS with respect to a longitudinal direction of the mask assembly M.

The vision portion 1600 may be arranged in the chamber 1100 and may photograph the positions of the display substrate DS and the mask assembly M. The vision portion 1600 may include a camera that photographs the display substrate DS and the mask assembly M. The positions of the display substrate DS and the mask assembly M may be determined based on an image taken by the vision portion 1600, and the position of the mask assembly M in the mask supporter 1200 may be finely adjusted based on the image.

The mask assembly M may be supported by the mask supporter 1200. The mask assembly M may include a mask frame MF, a first mask M1, a second mask M2, and a first support, which may be in the form of a substrate supporter DSS.

The mask frame MF may include an opening area OA. Thus, the deposition material may pass through the opening area OA. In an exemplary embodiment, the mask frame MF may include a plurality of frames surrounding the opening area OA. The plurality of frames may extend in the X direction or the Y direction.

The mask frame MF may include a metal having high rigidity, which is a material having little deformation. Also, a thickness MFt of the mask frame MF may be greater than the thickness M1$t$ of the first mask M1 or the thickness M2$t$ of the second mask M2. Thus, the deformation of the mask frame MF may be small when the first mask M1 or the second mask M2 is fixed.

The first mask M1 may be arranged on the mask frame MF. In this case, the first mask M1 may be integrally mounted to the mask frame MF. For example, the first mask M1 may be fixed to the mask frame MF in a tensioned state.

The first mask M1 may include an opening OP. In an exemplary embodiment, the first mask M1 may include at least one opening OP. The opening OP may overlap the opening area OA of the mask frame MF. In another exemplary embodiment, the first mask M1 may include a plurality of openings OP. In this case, the plurality of openings OP may be spaced apart from each other. The plurality of openings OP may overlap the opening area OA of the mask frame MF. The first mask M1 may include a stainless steel, an 64FeNi alloy sold under the trade designation INVAR by Aperam, of Luxembourg, Luxembourg (hereinafter referred to as "INVAR alloy"), nickel (Ni), cobalt (Co), Ni alloy, Ni—Co alloy, or the like.

The second mask M2 may be arranged on the first mask M1. In this case, the second mask M2 may be arranged to be connected to the mask frame MF. That is, the planar size of the second mask M2 may be greater than the planar size of the first mask M1. Thus, a central portion of the second mask M2 may overlap the first mask M1, and an end of the second mask M2 may be arranged on the mask frame MF. The second mask M2 may include a mesh portion MP and a blocking member, which may be in the form of a shield portion SP.

The mesh portion MP may have a generally mesh shape or a grid shape. In an exemplary embodiment, the mesh portion MP may be arranged such that a plurality of first wires W1 extending in the X direction intersect a plurality of second wires W2 extending in the Y direction intersecting the X direction. Thus, the plurality of first wires W1 and the plurality of second wires W2 may define a plurality of mesh holes MH. The plurality of first wires W1 and the plurality of second wires W2 may each include stainless steel, INVAR alloy, Ni, Co, Ni alloy, Ni—Co alloy, or the like.

The shape of each of the plurality of mesh holes MH may be varied. For example, each of the plurality of mesh holes MH may have a generally rectangular shape. As another example, each of the plurality of mesh holes MH may have a generally parallelogram shape or a generally rhombical shape. As another example, each of the plurality of mesh holes MH may have a generally polygonal shape.

The shield portion SP may shield a portion of the mesh portion MP. The shield portion SP may overlap the opening OP. When the first mask M1 includes a plurality of openings OP, a plurality of shield portions SP may also be provided. Thus, the plurality of shield portions SP may be respectively arranged in the plurality of openings OP.

The shield portion SP may shield the mesh hole MH. In an exemplary embodiment, the shield portion SP may entirely shield at least one of the plurality of mesh holes MH and may at least partially shield another one of the plurality of mesh holes MH. In another exemplary embodiment, the shield portion SP may entirely shield a plurality of adjacent mesh holes MH. In addition, the shield portion SP may be connected to the plurality of first wires W1 and the plurality of second wires W2. Thus, the shield portion SP may be stably supported by the plurality of first wires W1 and the plurality of second wires W2.

The shape of the shield portion SP may be varied. For example, the shield portion SP may have a generally circular or generally elliptical shape on a plan view. As another example, the shield portion SP may have a generally polygonal shape on a plan view. However, hereinafter, a case where the shield portion SP has a generally circular shape will be mainly described in detail.

The shield portion SP may include a stainless steel, an INVAR alloy, Ni, Co, Ni alloy, Ni—Co alloy, or the like. In an exemplary embodiment, the shield portion SP may include the same material as the mesh portion MP. In another exemplary embodiment, the shield portion SP may include a different material from the mesh portion MP. For example, the mesh portion MP may include one of a stainless steel, an INVAR alloy, Ni, Co, Ni alloy, and Ni—Co alloy, and the shield portion SP may include a different one of a stainless steel, an INVAR alloy, Ni, Co, Ni alloy, and Ni—Co alloy. The shield portion SP may be formed by an electro-forming method, as described hereinafter.

The substrate supporter DSS may support the display substrate DS on the second mask M2. A plurality of substrate supporters DSS may be provided. For example, a plurality of substrate supporters DSS may be arranged on the mask frame MF and spaced apart from each other. Thus, the plurality of substrate supporters DSS may stably support the display substrate DS.

In the illustrated exemplary embodiment, the substrate supporter DSS may separate the display substrate DS from the second mask M2. In this case, a height d of the substrate supporter DSS may be about 600 μm or more. Thus, a gap between the display substrate DS and the second mask M2 may be about 600 μm or more. The maximum height of the substrate supporter DSS may be changed according to the size of the shield portion SP.

The substrate supporter DSS may fix the second mask M2 to the mask frame MF. Because the second mask M2 includes the mesh portion MP, even when the second mask M2 is tensioned and fixed to the mask frame MF, the bonding strength of the second mask M2 may be lowered. In the illustrated exemplary embodiment, because the second mask M2 is arranged to be fixed between the substrate supporter DSS and the mask frame MF, the bonding strengths of the second mask M2 and the mask frame MF may increase. In an exemplary embodiment, the substrate supporter DSS, the second mask M2, and the mask frame MF may be connected to each other by welding. For example, after the substrate supporter DSS is arranged on the second mask M2, a portion of the substrate supporter DSS may be melted. In this case, the melted portion of the substrate supporter DSS may connect the substrate supporter DSS, the second mask M2, and the mask frame MF to each other.

In an exemplary embodiment, the substrate supporter DSS may be arranged along the mask frame MF. For example, the substrate supporter DSS may be spaced apart from the opening area OA and extend in at least one of the X direction and the Y direction along the mask frame MF. Hereinafter, the substrate supporter DSS extending in the Y direction along the mask frame MF will be described in detail.

In an exemplary embodiment, the length of the substrate supporter DSS may be greater than the width of the second mask M2. For example, the extended length of the substrate supporter DSS in the Y direction may be greater than the width of the second mask M2 in the Y direction. Thus, at least a portion of the substrate supporter DSS may be directly connected to the mask frame MF.

The substrate supporter DSS, the second mask M2, and the mask frame MF may be connected to each other. For example, the substrate supporter DSS and the second mask M2 may be connected to each other, the second mask M2 and the mask frame MF may be connected to each other, and the substrate supporter DSS and the mask frame MF may also be connected to each other. In this case, because one of the mask frame MF, the second mask M2, and the substrate supporter DSS fixes another one of the mask frame MF, the second mask M2, and the substrate supporter DSS, strong bonding strength may be secured.

As described above, the mask assembly M of some exemplary embodiments may include the second mask M2 including the mesh portion MP and the shield portion SP. Thus, the shield portion SP of the second mask M2 may be stably supported by the mesh portion MP. In addition, the shield portion SP may prevent a deposition material from being deposited on the display substrate DS. For example, when an opposite electrode including an opposite electrode hole is formed on the display substrate DS, the shield portion SP may prevent deposition material forming the opposite electrode corresponding to the opposite electrode hole from being deposited. Thus, a display device manufactured according to an exemplary embodiment may include a transmission area corresponding to the opposite electrode hole in a display area displaying an image, and light transmittance may be improved in the transmission area.

The mask assembly M of some exemplary embodiments may support the display substrate DS and may include the substrate supporter DSS that separates the display substrate DS from the second mask M2. Unlike the illustrated exemplary embodiment, when the shield portion SP is fixed by a rib or the like extending in the opening OP of the second mask M2, deposition material may not be uniformly deposited on the display substrate DS due to the rib. Thus, a dark line may be recognized in a display area, which displays an image, in a display device manufactured by a manufacturing apparatus including a rib. In illustrated exemplary embodiment, the shield portion SP may be fixed to the mesh portion MP, and the substrate supporter DSS separating the display substrate DS from the second mask M2 may be provided. In this case, even if the deposition material is partially shielded by the first wires W1 and the second wires W2 of the mesh portion MP, the deposition material may be uniformly deposited on a display area, which displays an image, in the display substrate DS, due to a shadow phenomenon.

Figure 4:
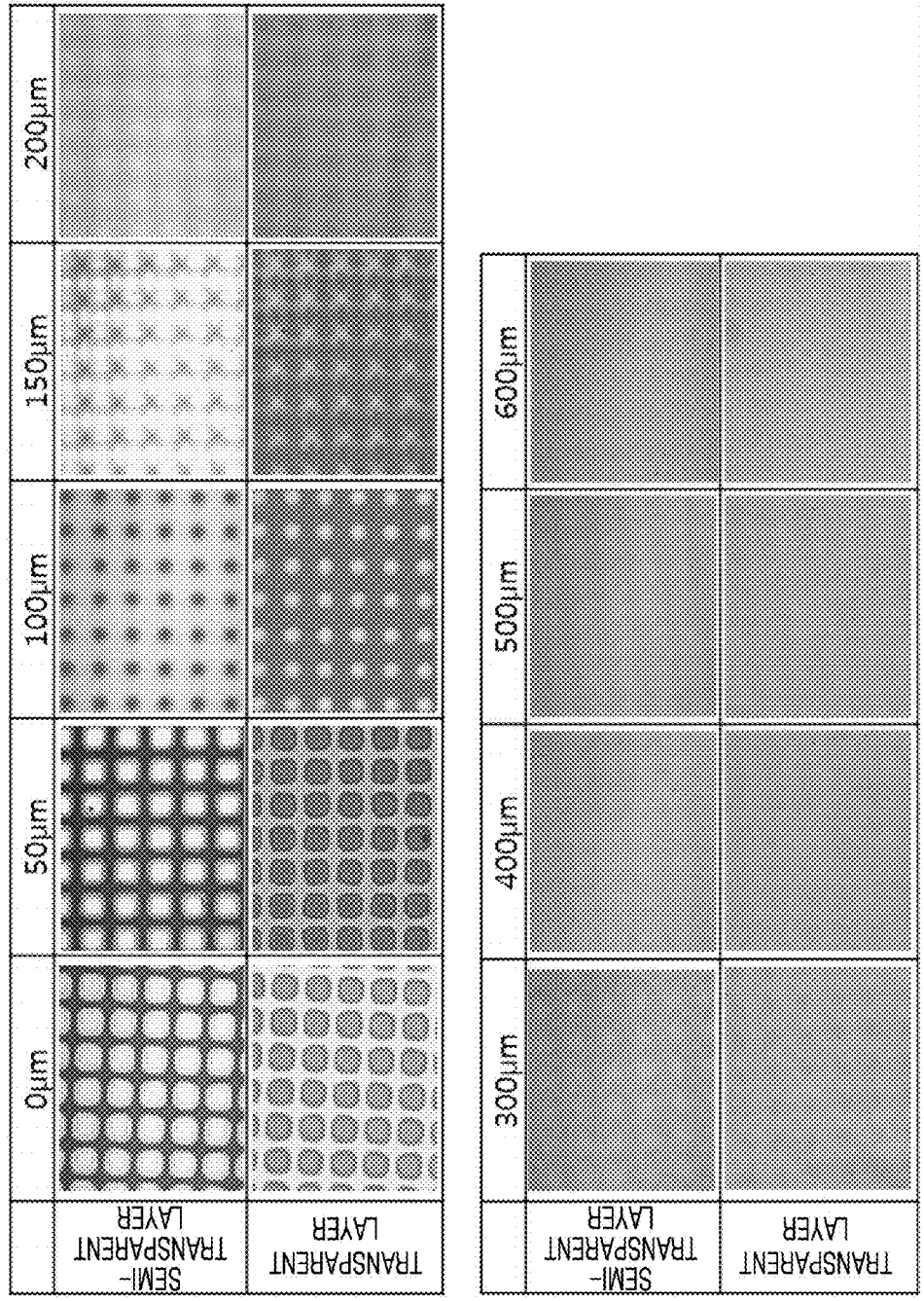
FIG. 4 is a pictorial table of exemplary experimental examples of an opposite electrode deposition pattern according to a gap between a display substrate and a second mask.

FIG. 4 is a pictorial table of exemplary experimental examples of an opposite electrode deposition pattern according to a gap between a display substrate and a second mask.

FIGS. 3 and 4 shows an opposite electrode deposition pattern according to a gap between the display substrate DS and the second mask M2 when the thickness of the first wire W1 and/or the thickness of the second wire W2 are about 11.4 um to about 29.1 um and the maximum width of the mesh hole MH is about 56.8 um.

When the gap between the display substrate DS and the second mask M2 is about 600 μm or more, a mesh pattern due to the mesh portion MP is not recognized and an opposite electrode is substantially uniformly deposited on the entire surface of the display substrate DS. In this case, when the opposite electrode is a transparent layer or a semi-transparent layer, the opposite electrode is substantially uniformly deposited on the entire surface of the display substrate DS.

The size (for example, diameter) of the shield portion SP needs to be greater than the transmission area, in which a deposition material is not deposited, in consideration of a shadow phenomenon, and the maximum gap between the second mask M2 and the display substrate also needs to be set in consideration of the size of the shield portion SP.

Figure 5:
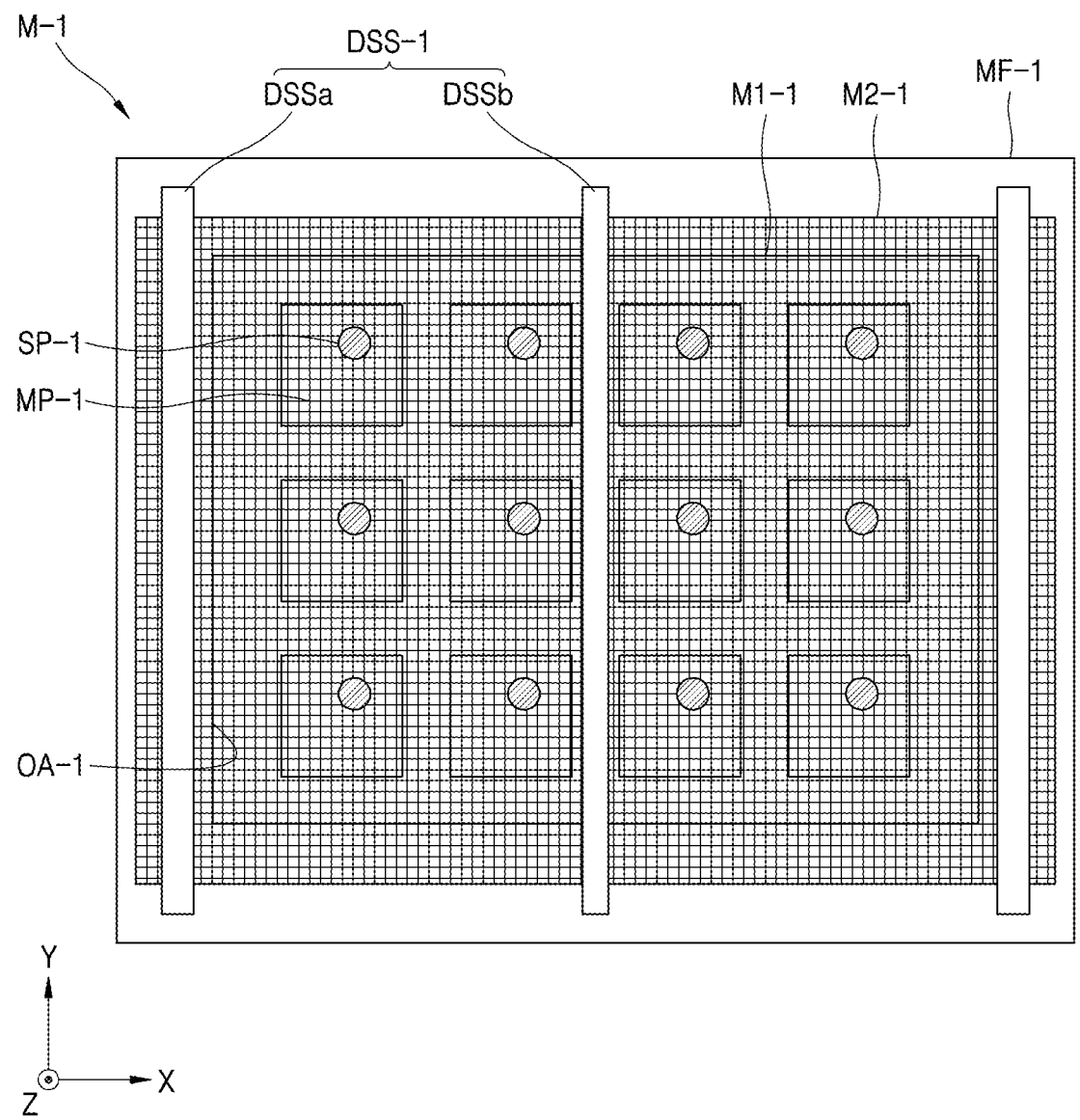
FIG. 5 is a plan view of another exemplary embodiment of a mask assembly constructed according to principles of the invention.

FIG. 5 is a plan view of another exemplary embodiment of a mask assembly constructed according to principles of the invention.

Referring to FIG. 5, the mask assembly M-1 may include a mask frame MF-1, a first mask M1-1, a second mask M2-1, and a substrate supporter DSS-1. The mask frame MF-1 may include an opening area OA-1, and the first mask M1-1 may be arranged in the mask frame MF-1 and include an opening. The second mask M2-1 may be arranged on the first mask M1-1 and include a mesh portion MP-1 having a mesh shape and a shield portion SP-1 shielding a portion of the mesh portion MP-1, and the substrate supporter DSS-1 may support a display substrate on the second mask M2-1 and separate the display substrate from the second mask M2-1. The mask frame MF-1, the first mask M1-1, the second mask M2-1, the mesh portion MP-1, and the shield portion SP-1 are substantially the same as the mask frame MF, the first mask M1, the second mask M2, the mesh portion MP, and the shield portion SP of FIG. 3, and thus, detailed descriptions thereof will be omitted to avoid redundancy.

The substrate supporter DSS-1 may fix the second mask M2-1 to the mask frame MF-1. Because the second mask M2-1 is arranged to be fixed between the substrate supporter DSS-1 and the mask frame MF-1, the bonding strengths of the second mask M2-1 and the mask frame MF-1 may increase.

In the illustrated embodiment, the substrate supporter DSS-1 may include a first substrate supporter DSSa and a second substrate supporter DSSb. In this case, the first substrate supporter DSSa may be spaced apart from the opening area OA-1 and arranged along the mask frame MF-1, and the second substrate supporter DSSb may intersect the opening area OA-1. The second substrate supporter DSSb may extend in at least one of the X direction and the Y direction to intersect the opening area OA-1. Hereinafter, the second substrate supporter DSSb extending in the Y direction will be described in detail.

In an exemplary embodiment, a plurality of first substrate supporters DSSa may be provided, and the plurality of first substrate supporters DSSa may be spaced apart from each other and arranged along the mask frame MF-1. In this case, the second substrate supporter DSSb may be arranged between the plurality of first substrate supporters DSSa. Thus, warpage due to the self-weight of the display substrate DS may be prevented.

Hereinafter, a method of manufacturing the mask assembly M described above will be described in detail.

Figure 6:
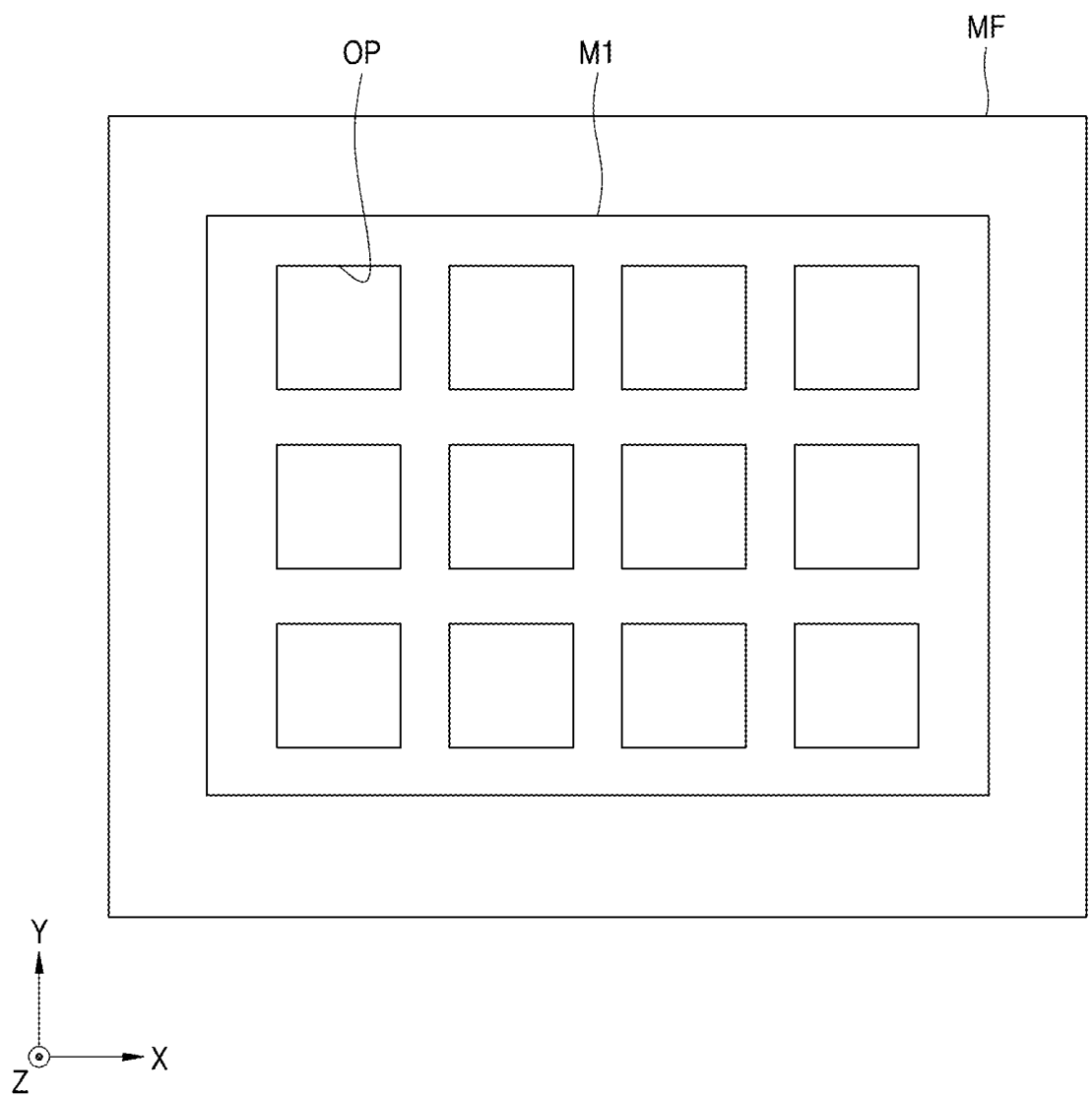
FIGS. 6, 7, and 8A are plan views illustrating an exemplary embodiment of a method of manufacturing a mask assembly according to principles of the invention.
Figure 7:
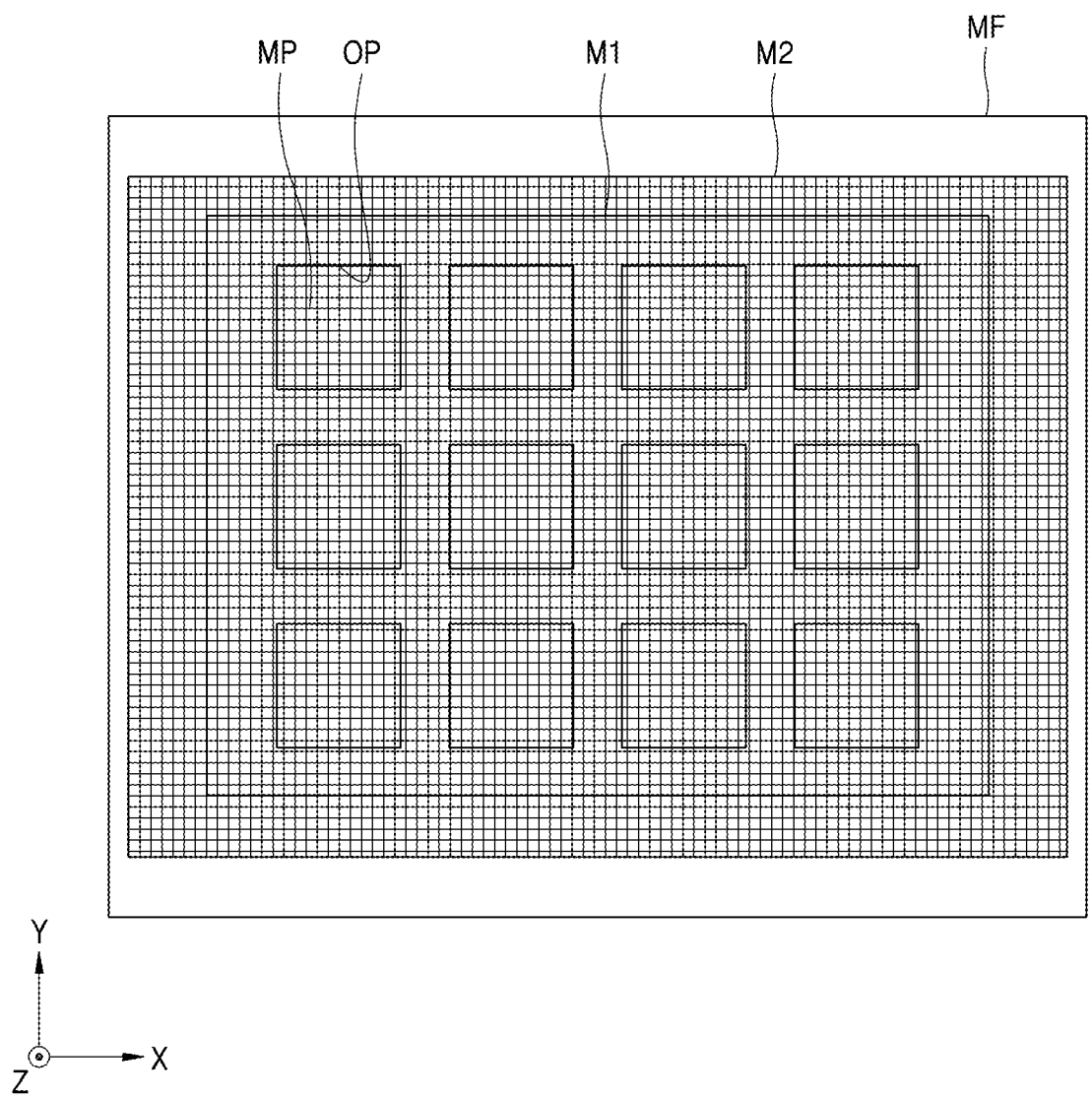
Figure 8A:
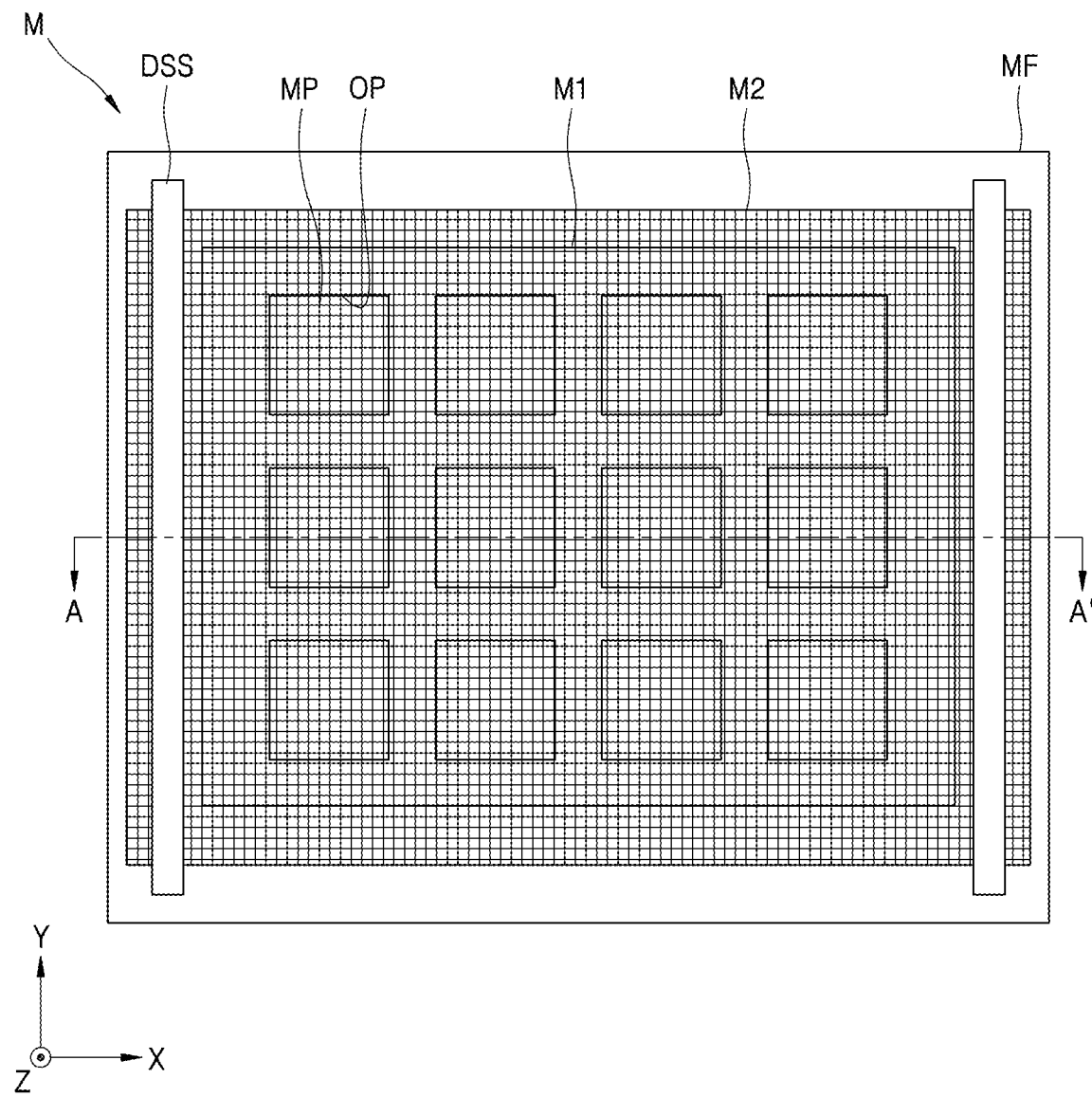
Figure 8B:
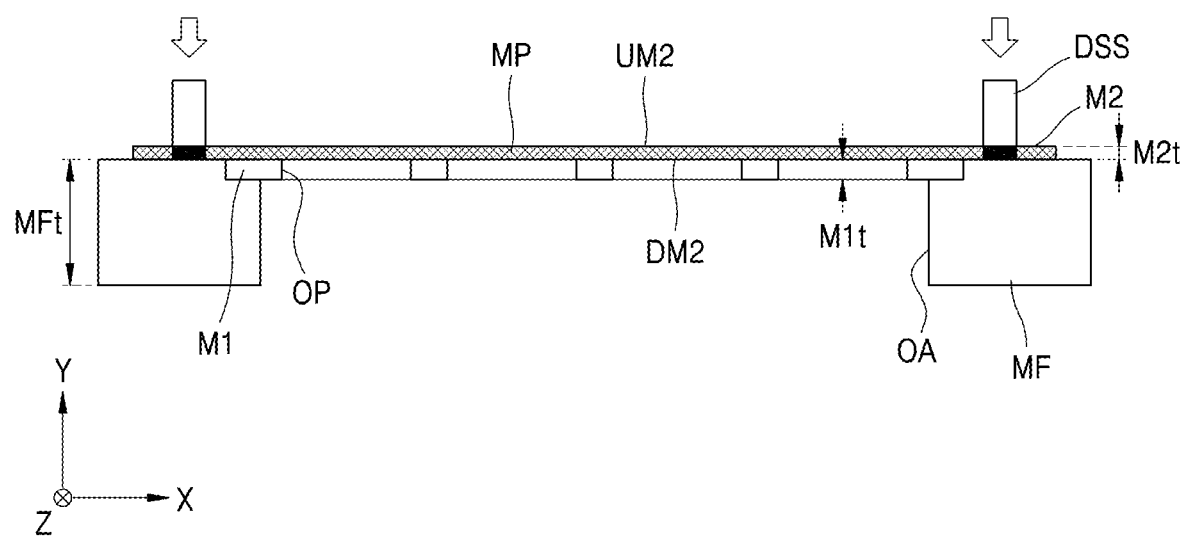
FIG. 8B is a cross-sectional view of the mask assembly taken along line A-A' of FIG. 8A.

FIGS. 6, 7, and 8A are plan views illustrating an exemplary embodiment of a method of manufacturing a mask assembly according to principles of the invention. FIG. 8B is a cross-sectional view of the mask assembly taken along line A-A' of FIG. 8A. FIGS. 9A to 9E are plan views of an exemplary embodiment of a portion of a mask assembly for illustrating a method of manufacturing a shield portion according to principles of the invention. FIG. 10 is a plan view illustrating an exemplary embodiment of a method of manufacturing a mask assembly according to principles of the invention. In FIGS. 6 to 10, the same reference numerals as in FIGS. 1 to 3 refer to the same members, and thus, repeated descriptions will be omitted to avoid redundancy.

Referring to FIG. 6, a first mask M1 including an opening OP may be fixed to a mask frame MF including an opening area. In this case, the first mask M1 may be tensioned and fixed to the mask frame MF.

Next, referring to FIG. 7, a second mask M2 including a mesh portion MP having a generally mesh shape may be arranged on the first mask M1. In an exemplary embodiment, the second mask M2 may be fixed to the mask frame MF. For example, the second mask M2 may be tensioned and fixed to the mask frame MF. In another exemplary embodiment, the second mask M2 may be fixed to the mask frame MF together with a substrate supporter DSS.

Next, referring to FIGS. 8A and 8B, the substrate supporter DSS may be fixed on the second mask M2. The thickness MFt of the mask frame MF may be greater than the thickness M1t of the first mask M1 or the thickness M2t of the second mask M2.

The substrate supporter DSS may be fixed corresponding to the mask frame MF. In an exemplary embodiment, the substrate supporter DSS may be spaced apart from an opening area OA of the mask frame MF and fixed on the mask frame MF. In another exemplary embodiment, a plurality of substrate supporters DSS may be provided, and one of the plurality of substrate supporters DSS may be fixed across the opening area OA of the mask frame MF.

In an exemplary embodiment, the length of the substrate supporter DSS may be greater than the width of the second mask M2. For example, the extended length of the substrate supporter DSS in the Y direction may be greater than the width of the second mask M2 in the Y direction. Thus, at least a portion of the substrate supporter DSS may be directly connected to the mask frame MF.

In an exemplary embodiment, the substrate supporter DSS, the second mask M2, and the mask frame MF may be connected to each other. For example, the substrate supporter DSS and the second mask M2 may be connected to each other, the second mask M2 and the mask frame MF may be connected to each other, and the substrate supporter DSS and the mask frame MF may also be connected to each other. In this case, because one of the mask frame MF, the second mask M2, and the substrate supporter DSS fixes another one of the mask frame MF, the second mask M2, and the substrate supporter DSS, strong bonding strength is provided.

In an exemplary embodiment, the substrate supporter DSS, the second mask M2, and the mask frame MF may be fixed by welding. For example, after the substrate supporter DSS is arranged on the second mask M2, a portion of the substrate supporter DSS may be melted. In this case, the melted portion of the substrate supporter DSS may connect the substrate supporter DSS, the second mask M2, and the mask frame MF to each other.

Next, a shield portion SP that shields a portion of the mesh portion MP may be formed. In an exemplary embodiment, the mask assembly M being manufactured may be inverted. For example, an upper surface UM2 of the second mask M2 may be changed from facing a +Z direction to face a −Z direction, and a lower surface DM2 of the second mask M2 may be changed from facing the −Z direction to face the +Z direction.

Next, in an exemplary embodiment, the shield portion SP may be formed by an electro-forming method. The electro-forming method is a technique of forming a metal shape by using the principle of electroplating.

Figure 9A:
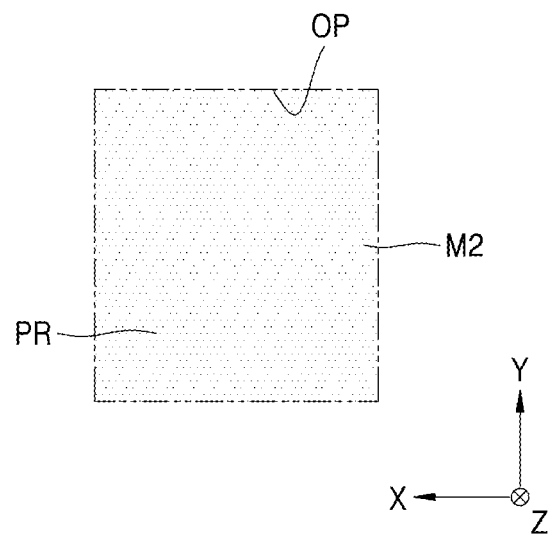
FIGS. 9A to 9E are plan views of an exemplary embodiment of a portion of a mask assembly for illustrating a method of manufacturing a shield portion according to principles of the invention.
Figure 10:
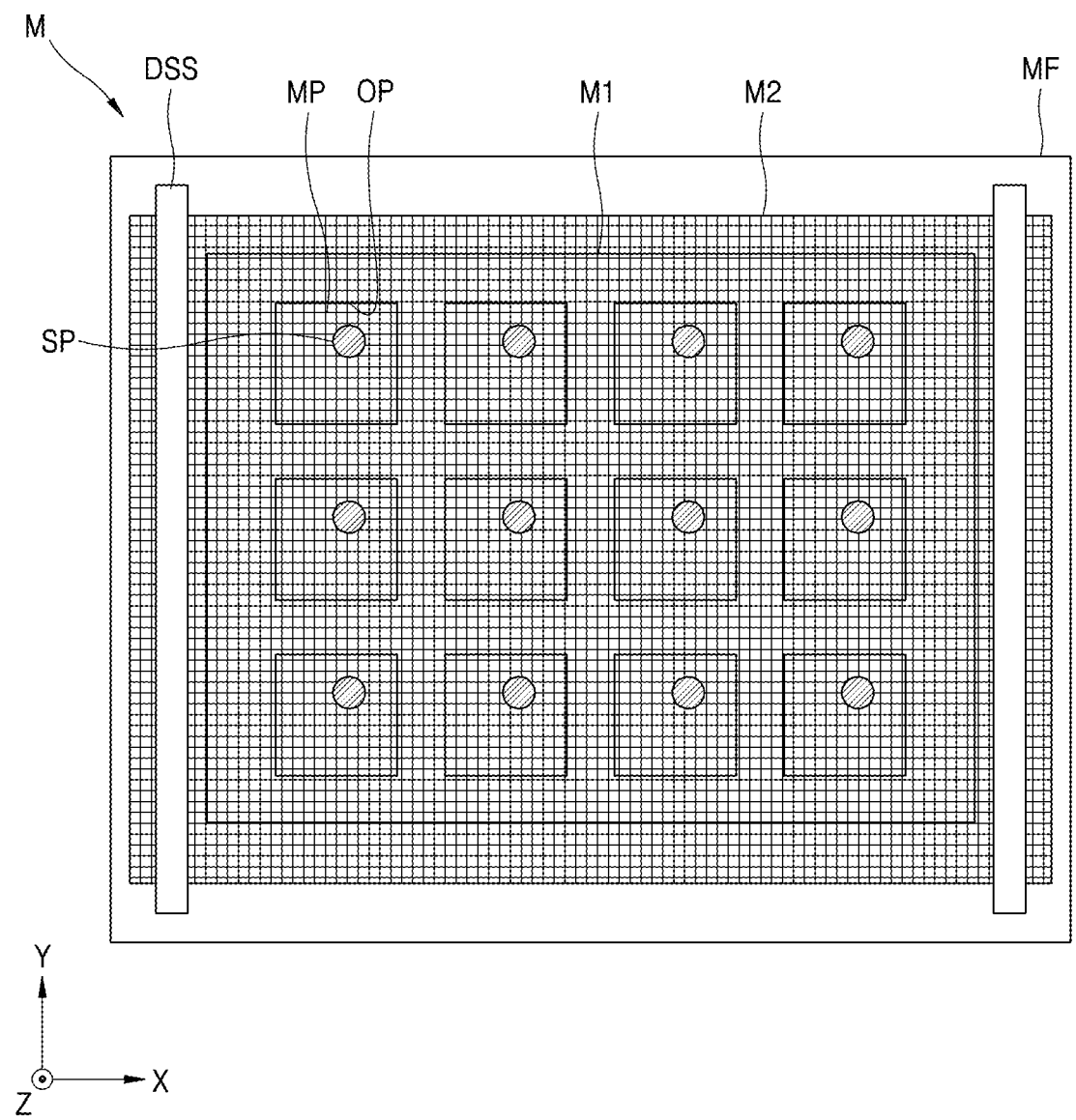
FIG. 10 is a plan view illustrating an exemplary embodiment of a method of manufacturing a mask assembly according to principles of the invention.

Referring to FIG. 9A, first, a photoresist PR may be formed on the second mask M2. The photoresist PR may be a positive-type photoresist or a negative-type photoresist and the second mask M2 may be coated with the photoresist PR. Specifically, in the positive-type photoresist, a light-exposed area is etched in the subsequent development process. On the contrary, in the negative-type photoresist, the remaining area except the light-exposed area is etched. Hereinafter, a case where the photoresist PR is a positive-type photoresist will be mainly described in detail.

The photoresist PR may be formed by applying a photoresist solution to the second mask M2 by various methods such as spin-coating, spraying, or immersion.

In addition, a process of polishing the top surface of the second mask M2 to be coated with the photoresist PR may be additionally performed before the photoresist PR is coated on the second mask M2.

Figure 9B:
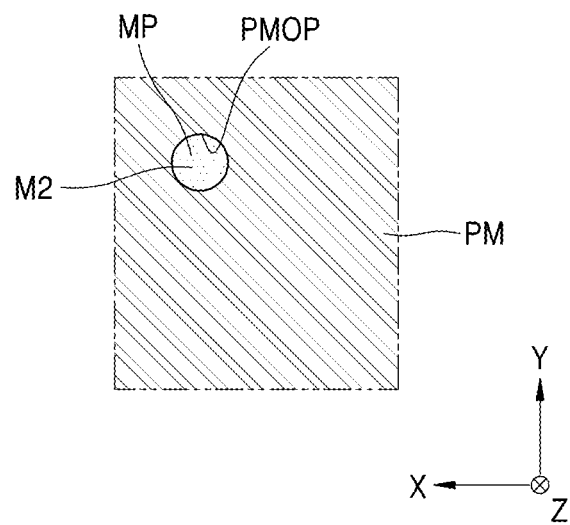

Next, referring to FIG. 9B, an exposure mask PM may overlap the second mask M2 to expose at least a portion of the photoresist PR. The exposure mask PM may include an exposure opening PMOP, and a portion of the photoresist PR corresponding to the exposure opening PMOP may be exposed. In this case, the portion corresponding to the exposure opening PMOP may be a portion where a shield portion is formed.

Figure 9C:
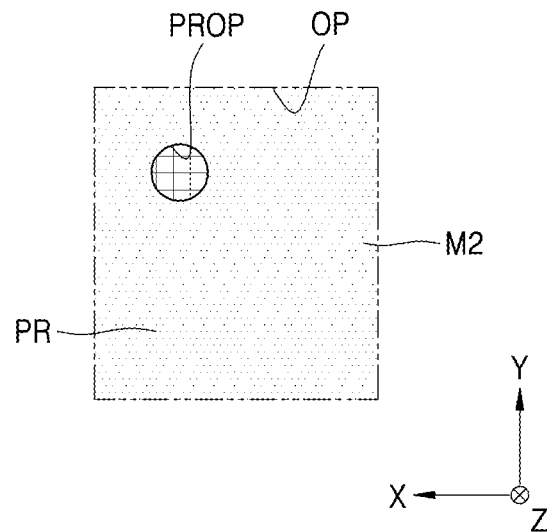

Next, referring to FIG. 9C, the photoresist PR may be developed. Thus, a portion of the photoresist PR may be removed. The photoresist PR is a photoresist using a positive-type photoresist solution, and when a development process is performed, an exposed area of the photoresist PR may be removed. Thus, a photoresist opening PROP may be formed.

Figure 9D:
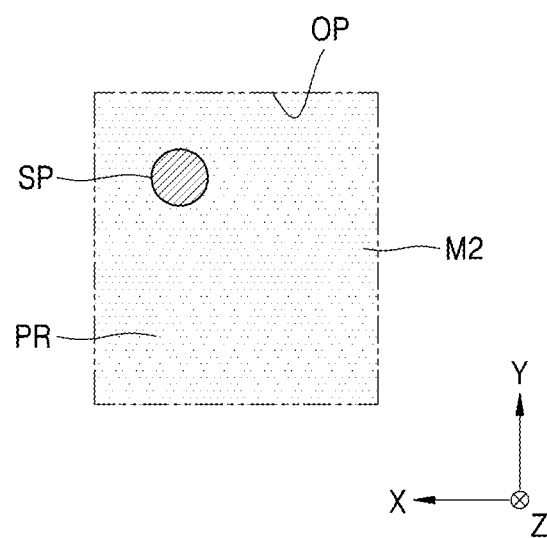

Next, referring to FIG. 9D, a shield portion SP may be formed using an electro-forming method. The shield portion SP may include a stainless steel, an INVAR alloy, Ni, Co, Ni alloy, Ni—Co alloy, or the like. In an exemplary embodiment, the shield portion SP may include the same material as the mesh portion MP. In another exemplary embodiment, the shield portion SP may include a different material from the mesh portion MP. For example, the mesh portion MP may include one of a stainless steel, an INVAR alloy, Ni, Co, Ni alloy, and Ni—Co alloy, and the shield portion SP may include a different one of a stainless steel, an INVAR alloy, Ni, Co, Ni alloy, and Ni—Co alloy.

Figure 9E:
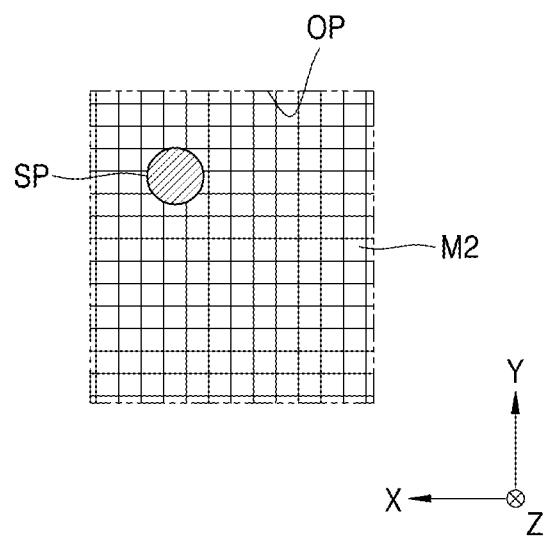

Next, referring to FIG. 9E, the remaining portion of the photoresist PR may be removed. Thus, referring to FIG. 10, a mask assembly M including the shield portion SP shielding a portion of the mesh portion MP may be formed.

In another exemplary embodiment, the mesh portion MP and the shield portion SP may be formed by a laser patterning method of irradiating a laser to the second mask M2. Specifically, the mask assembly M may be formed by irradiating a laser to a region corresponding to the mesh portion MP and not irradiating a laser to a region corresponding to the shield portion SP.

Figure 11:
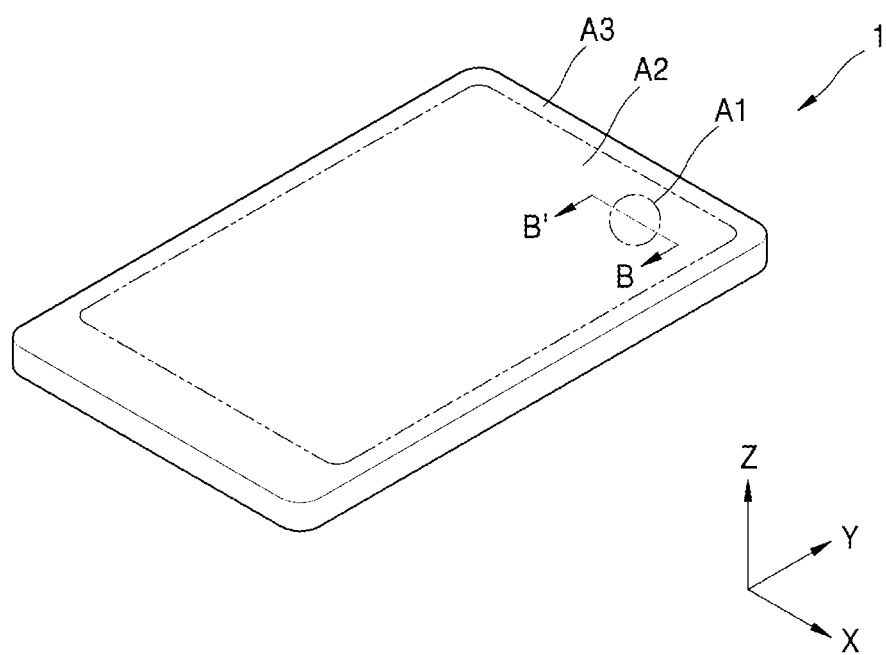
FIG. 11 is a perspective view of an exemplary embodiment of a display device manufactured using the apparatus of FIG. 1.

A display device 1 of FIG. 11 may be manufactured using the apparatus 1000 for manufacturing a display device. First, the display device 1 manufactured by the apparatus 1000 will be described in detail, and then a method of manufacturing the display device 1 will be described.

The display device 1 is a device that displays an image, and may be a mobile device that may be carried, such as a game machine, a multimedia device, or a miniature personal computer (PC). The display device 1 to be described later may include a liquid crystal display, an electrophoretic display, an organic light-emitting display, an inorganic electroluminescence display (i.e., inorganic light-emitting display), a field emission display, a surface-conduction electron-emitter display, a quantum dot display, a plasma display, a cathode ray display, or the like. Hereinafter, as the display device 1 according to an exemplary embodiment, an organic light-emitting display will be described as an example. However, the exemplary embodiments may include various types of display devices as described above.

FIG. 11 is a perspective view of an exemplary embodiment of a display device manufactured using the apparatus of FIG. 1.

Referring to FIG. 11, the display device 1 may include a first area A1, a second area A2, and a third area A3.

The first area A1 may be an area in which components capable of providing various functions to the display device 1 are arranged. For example, when the components include a sensor, a camera, or the like using light, the first area A1 corresponds to a transmission area through which light from the sensor or light traveling through the camera may be transmitted.

The second area A2 may entirely surround the first area A1. The second area A2 may include a plurality of pixels, for example, an array of pixels, and the second area A2 may display an image through the array of pixels. The second area A2 corresponds to a display area capable of displaying an image.

The third area A3 may be arranged to surround the second area A2. The third area A3 is a non-display area in which pixels are not arranged, and various types of wiring lines and internal circuits may be arranged in the third area A3.

FIG. 11 illustrates that the first area A1 is arranged on the upper right side of the display device 1. However, in another exemplary embodiment, the first area A1 may be arranged in a central portion of the second area A2 in a width direction (e.g., ±X direction) of the display device 1, or may be arranged on the upper left side of the second area A2. Also, the first area A1 may be arranged at various positions such as on the upper side, in the middle, or on the lower side in a length direction (e.g., a ±Y direction) of the display device 1.

FIG. 11 illustrates that the display device 1 includes one first area A1, but in another exemplary embodiment, the display device 1 may include a plurality of first areas A1.

Figure 12:
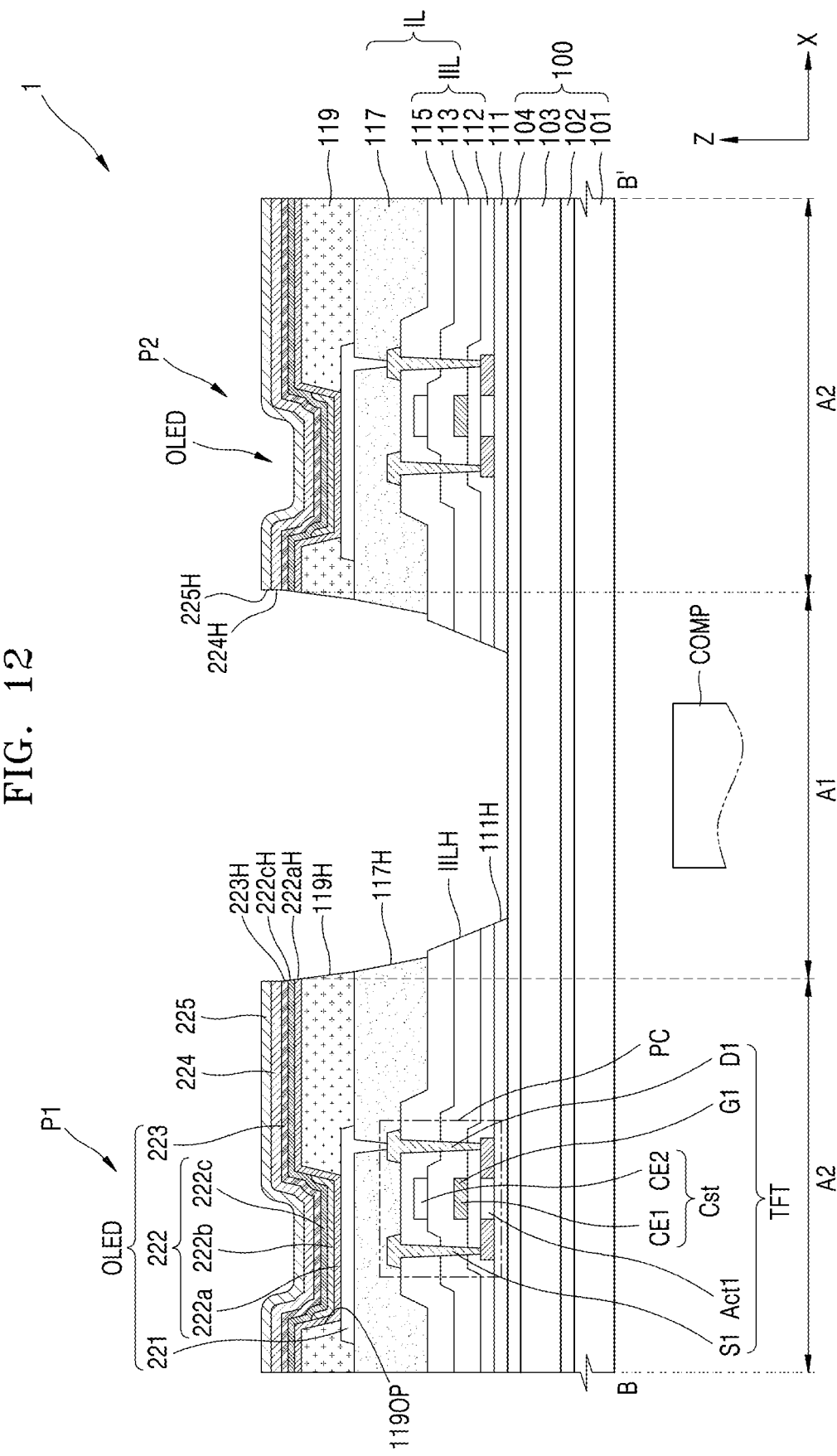
FIG. 12 is a simplified cross-sectional view of the display device taken along line B-B' of FIG. 11.

FIG. 12 is a simplified cross-sectional view of the display device taken along line B-B' of FIG. 11.

Referring to FIG. 12, the display device 1 may include a component COMP, a substrate 100, a buffer layer 111, a plurality of pixels (i.e., a first pixel P1 and a second pixel P2), and an insulating layer IL. The insulating layer IL may include an inorganic insulating layer IIL and a planarization layer 117.

The component COMP may be arranged corresponding to the first area A1. The component COMP may be an electronic element using light or sound. For example, the electronic element may be a sensor that measures distance, such as a proximity sensor, a sensor that recognizes a portion (e.g., fingerprint, iris, and face) of a user's body, a small lamp that outputs light, or an image sensor (e.g., a camera) that captures an image. An electronic element using light may use light of various wavelength bands, such as visible light, infrared light, and ultraviolet light. An electronic element using sound may use ultrasound or sound in other frequency bands.

In some exemplary embodiments, the component COMP may include sub-components such as a light-emitting portion and a light-receiving portion. The light-emitting portion and the light-receiving portion may be integrated with each other or physically separated from each other, and a pair formed by the light-emitting portion and the light-receiving portion may form one component COMP.

The substrate 100 may include a base layer including a polymer resin, and a barrier layer including an inorganic insulating material. For example, the substrate 100 may include a first base layer 101, a first barrier layer 102, a second base layer 103, and a second barrier layer 104, which are sequentially stacked. Each of the first base layer 101 and the second base layer 103 may include a polyethersulfone, a polyarylate, a polyetherimide, a polyethylene naphthalate, a polyethylene terephthalate, a polyphenylene sulfide, a polyimide, a polycarbonate (PC), a cellulose tri acetate (TAC), a cellulose acetate propionate, or the like. Each of the first barrier layer 102 and the second barrier layer 104 may include inorganic insulating materials such as a silicon oxide, a silicon oxynitride, and/or a silicon nitride. In another exemplary embodiment, the substrate 100 may include glass.

The buffer layer 111 may be arranged on the substrate 100. The buffer layer 111 may reduce or block the penetration of foreign substances, moisture, or external air from the bottom of the substrate 100. The buffer layer 111 may include an inorganic material such as an oxide or a nitride, an organic material, or an organic-inorganic composite, and may have a single layer or multi-layer structure including the inorganic material and the organic material.

The plurality of pixels, i.e., the first pixel P1 and the second pixel P2, may be arranged in the second area A2. For example, the first pixel P1 and the second pixel P2 may be arranged in the second area A2 with the first area A1 therebetween. The first pixel P1 and the second pixel P2 may each include a pixel circuit PC and an organic light-emitting diode OLED. The first pixel P1 and the second pixel P2 are substantially the same, and thus will be described in detail with reference to the first pixel P1.

The pixel circuit PC including a thin film transistor TFT and a storage capacitor Cst may be arranged on the buffer layer 111. The thin film transistor TFT may include a semiconductor layer Act1, a gate electrode G1 overlapping a channel region of the semiconductor layer Act1, and a source electrode S1 and drain electrode D1 respectively connected to a source region and a drain region of the semiconductor layer Act1. A gate insulating layer 112 may be interposed between the semiconductor layer Act1 and the gate electrode G1, and a first interlayer insulating layer 113 and a second interlayer insulating layer 115 may be arranged between the gate electrode G1 and the source electrode S1, or between the gate electrode G1 and the drain electrode D1.

The storage capacitor Cst may be arranged to overlap the thin film transistor TFT. The storage capacitor Cst may include a first capacitor plate CE1 and a second capacitor plate CE2, which overlap each other. In some exemplary embodiments, the gate electrode G1 of the thin film transistor TFT may include the first capacitor plate CE1 of the storage capacitor Cst. The first interlayer insulating layer 113 may be arranged between the first storage plate CE1 and the second storage plate CE2.

The semiconductor layer Act1 may include polysilicon. In some exemplary embodiments, the semiconductor layer Act1 may include amorphous silicon. In some exemplary embodiments, the semiconductor layer Act1 may include an oxide of at least one material selected from indium (In), gallium (Ga), tin (Sn), zirconium (Zr), vanadium (V), hafnium (Hf), cadmium (Cd), germanium (Ge), chromium (Cr), titanium (Ti), and zinc (Zn). The semiconductor layer Act1 may include a channel region and a source region and a drain region doped with impurities.

The gate insulating layer 112 may include an inorganic insulating material such as a silicon oxide, a silicon oxynitride, or a silicon nitride and may have a single layer or multi-layer structure including the aforementioned material.

The gate electrode G1 or the first capacitor plate CE1 may include a low-resistance conductive material such as molybdenum (Mo), aluminum (Al), copper (Cu), and/or titanium (Ti) and may have a single layer or multi-layer structure including the aforementioned material.

The first interlayer insulating layer 113 may include an inorganic insulating material such as a silicon oxide, a silicon oxynitride, or a silicon nitride and may have a single layer or multi-layer structure including the aforementioned material.

The second capacitor CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may have a single layer or multi-layer structure including the aforementioned material.

The second interlayer insulating layer 115 may include an inorganic insulating material such as a silicon oxide, a silicon oxynitride, and a silicon nitride and may have a single layer or multi-layer structure including the aforementioned material.

The source electrode S1 or the drain electrode D1 may include Al, Pt, Pd, Ag, Mg, Au, Nd, Ir, Cr, Ni, Ca, Mo, Ti, W, and/or Cu and may have a single layer or multi-layer structure including the aforementioned material. For example, the source electrode S1 or the drain electrode D1 may have a three-layer structure of a titanium layer/aluminum layer/titanium layer.

The planarization layer 117 may include a different material than at least one inorganic insulating layer arranged thereunder, for example, the gate insulating layer 112, the first interlayer insulating layer 113, and the second interlayer insulating layer 115. The planarization layer 117 may include an organic insulating material. The planarization layer 117 may include an organic insulating material such as an acrylic, a benzocyclobutene (BCB), a polyimide, a hexamethyldisiloxane (HMDSO), or the like. The organic insulating material of the planarization layer 117 may be a photosensitive organic insulating material.

A pixel electrode 221 may be arranged on the planarization layer 117. The pixel electrode 221 may be electrically connected to the thin film transistor TFT through a contact hole formed in the planarization layer 117.

The pixel electrode 221 may include a reflective layer including Ag, Mg, Al, Pt, Pd, Au, Ni, Nd, Ir, Cr, or a compound thereof. The pixel electrode 221 may include a reflective layer including the aforementioned material, and a transparent conductive layer arranged above or/and below the reflective layer. The transparent conductive layer may include an indium tin oxide (ITO), an indium zinc oxide (IZO), a zinc oxide (ZnO), an indium oxide ($In_2O_3$), an indium gallium oxide (IGO), an aluminum zinc oxide (AZO), or the like. In an exemplary embodiment, the pixel electrode 221 may have a three-layer structure in which an ITO layer, an Ag layer, and an ITO layer are sequentially stacked.

A pixel-defining layer 119 may be arranged on the pixel electrode 221. The pixel-defining layer 119 may cover an edge of the pixel electrode 221 and include an opening 1190P overlapping a central portion of the pixel electrode 221. The pixel-defining layer 119 may include an organic insulating material and/or an inorganic insulating material. The opening 1190P may define an emission area of light emitted from the organic light-emitting diode OLED.

The intermediate layer 222 includes an emission layer 222b overlapping the pixel electrode 221. The emission layer 222b may include an organic material. The emission layer 222b may include a polymer organic material or a low molecular organic material that emits light of a certain color. The emission layer 222b may be formed through a deposition process using a mask, as described above.

A first functional layer 222a and a second functional layer 222c may be arranged below and/or above the emission layer 222b. The first functional layer 222a may include a single layer or multiple layers. For example, when the first functional layer 222a includes a polymer material, the first functional layer 222a may be a hole transport layer (HTL) having a single layer structure and may include a poly-(3,4)-ethylene-dihydroxy thiophene (PEDOT) or a polyaniline. When the first functional layer 222a includes a low molecular material, the first functional layer 222a may include a hole injection layer (HIL) and an HTL.

The second functional layer 222c may be optional. For example, when the first functional layer 222a and the emission layer 222b each include a polymer material, it may be desirable to form the second functional layer 222c. The second functional layer 222c may have a single layer or multiple layers. The second functional layer 222c may include an electron transport layer (ETL) and/or an electron injection layer (EIL).

An opposite electrode 223 may include a conductive material having a relatively low work function. For example, the opposite electrode 223 may include a (semi) transparent layer including Ag, Mg, Al, Ni, Cr, Li, Ca, or an alloy thereof. Alternatively, the opposite electrode 223 may further include a layer including a material, such as an ITO, an IZO, a ZnO, or an $In_2O_3$, on the (semi) transparent layer including the aforementioned material. In an exemplary embodiment, the opposite electrode 223 may include Ag and Mg.

A stacked structure, in which the pixel electrode 221, the intermediate layer 222, and the opposite electrode 223 are sequentially stacked, may form a light-emitting diode, for example, an organic light-emitting diode OLED.

A capping layer 224 may be arranged on the opposite electrode 223. In addition, a light extraction layer 225 may be arranged on the capping layer 224. The capping layer 224 and the light extraction layer 225 may be layers for improving extraction of light emitted from the organic light-emitting diode OLED. The capping layer 224 may include at least one selected from among tris-8-hydroxyquinoline aluminum (Alq3), ZnSe, 2,5-bis(6'-(2',2"-bipyridine))-1,1-dimethyl-3,4-diphenylsilole, 4'-bis[N-(1-napthyl)-N-phenyl-amion] biphenyl (a-NPD), N,N'-diphenyl-N,N'-bis(3-methylphenyl)-1,1'biphenyl-4,4'-diamine (TPD), and 1,1-Bis[(di-4-tolylamino)phenyl]cyclohexane (TAPC). The light extraction layer 225 may include at least one selected from among $CaF_2$, NaF, $Na_3AlF_6$, SiOx, $AlF_3$, LiF, $MgF_2$, and $IF_3$.

An encapsulation layer may be arranged on the opposite electrode 223. In an exemplary embodiment, the encapsulation layer may include at least one inorganic encapsulation layer and at least one organic encapsulation layer.

The at least one inorganic encapsulation layer may include one or more inorganic materials from among an aluminum oxide, a titanium oxide, a tantalum oxide, a hafnium oxide, a zinc oxide, a silicon oxide, a silicon nitride, and a silicon oxynitride. The at least one organic encapsulation layer may include a polymer-based material. Examples of the polymer-based material may include an acryl-based resin, an epoxy-based resin, a polyimide, and a polyethylene. In an exemplary embodiment, the organic encapsulation layer may include an acrylate.

In another exemplary embodiment, the encapsulation layer may have a structure in which the substrate 100 and an upper substrate that is a transparent member are coupled to each other via a sealing member and thus an internal space between the substrate 100 and the upper substrate is sealed. In this case, moisture absorbent, a filling material, or the like may be located in the internal space. The sealing member may be a sealant. In another exemplary embodiment, the sealing member may include a material cured by laser. For example, the sealing member may be a frit. In detail, the sealing member may include a urethane-based resin, an epoxy-based resin, or an acryl-based resin that is an organic sealant, or a silicone that is an inorganic sealant. An urethane acrylate, for example, may be used as the urethane-based resin. A butylacrylate or an ethylhexylacrylate, for example, may be used as the acryl-based resin. The sealing member may include a material cured by heat.

A touch electrode layer including touch electrodes may be located on the encapsulation layer, and an optical functional layer may be located on the touch electrode layer. The touch electrode layer may obtain coordinate information according to an external input, for example, a touch event. The optical functional layer may reduce reflectivity of light (external light) incident onto the display device 1 from the outside and/or may increase color purity of light emitted from the display device 1. In an exemplary embodiment, the optical functional layer may include a retarder and a polarizer. The retarder may be of a film type or liquid crystal coating type and may include a λ/2 retarder and/or a λ/4 retarder. The polarizer may also be of a film type or liquid crystal coating type. The film type may include an elongation type synthetic resin film, and the liquid crystal coating type may include liquid crystals arranged in a predetermined arrangement. The retarder and the polarizer may further include a protective film.

In another exemplary embodiment, the optical functional layer may include a black matrix and color filters. The color filters may be arranged in consideration of color of light emitted from each of pixels of the display device 1. Each of the color filters may include a red, green, or blue pigment or dye. Alternatively, each of the color filters may further include a quantum dot in addition to the pigment or dye described above. Alternatively, some of the color filters may not include the pigment or dye described above and may include scattered particles such as a titanium oxide.

In another exemplary embodiment, the optical functional layer may include a destructive interference structure. The offset interference structure may include a first reflective layer and a second reflective layer that are located on different layers. First reflected light and second reflected light reflected from the first reflective layer and the second reflective layer, respectively, may be destructive-interfered. Thus, reflectivity of the external light may be reduced.

An adhesive member may be located between the touch electrode layer and the optical functional layer. A well-known general adhesive member in the art may be used as the adhesive member without limitations. The adhesive member may be a pressure sensitive adhesive (PSA).

In an exemplary embodiment, at least one of the buffer layer 111, the inorganic insulating layer IIL, the planarization layer 117, and the pixel-defining layer 119 may include a hole corresponding to the first area A1. In an exemplary embodiment, a first hole 111H of the buffer layer 111, a second hole IILH of the inorganic insulating layer IIL, a third hole 117H of the planarization layer 117, and a fourth hole 119H of the pixel-defining layer 119 may be arranged corresponding to the first area A1. In addition, the first hole 111H to the fourth hole 119H may overlap each other and be connected to each other. In another exemplary embodiment, the buffer layer 111 does not include a hole and is continuously arranged in the first area A1, and the second hole IILH, the third hole 117H, and the fourth hole 119H may be arranged corresponding to the first area A1. However, various modifications are possible. As another example, the buffer layer 111, the inorganic insulating layer IIL, and the planarization layer 117 may be continuously arranged in the first area A1, and the fourth hole 119H may be arranged in the first area A1.

In some exemplary embodiments, the buffer layer 111, the inorganic insulating layer IIL, the planarization layer 117, and the pixel-defining layer 119 may be continuously arranged without a hole in the first area A1.

In the illustrated embodiment, the display device 1 manufactured using the apparatus 1000 may include at least one of a first functional layer hole 222aH, a second functional layer hole 222cH, an opposite electrode hole 223H, a capping layer hole 224H, and a light extraction layer hole 225H. For example, the display device 1 may include the first functional layer hole 222aH, the second functional layer hole 222cH, the opposite electrode hole 223H, the capping layer hole 224H, and the light extraction layer hole 225H. In this case, each of the first functional layer hole 222aH, the second functional layer hole 222cH, the opposite electrode hole 223H, the capping layer hole 224H, and the light extraction layer hole 225H may be arranged corresponding to the first area A1. Thus, the light transmittance of the component COMP may be improved.

Hereinafter, a method of manufacturing a display device including the first functional layer hole 222aH, the second functional layer hole 222cH, the opposite electrode hole 223H, the capping layer hole 224H, and the light extraction layer hole 225H will be described in detail. In particular, a method of manufacturing a display device including the opposite electrode hole 223H will be described in detail.

Referring to FIGS. 1-3 and 12, first, a display substrate DS may be arranged in the chamber 1100 of FIG. 1. Specifically, the display substrate DS may be mounted on the substrate supporter DSS. In this case, the display substrate DS may be a display device being manufactured and may be in a state in which the second functional layer 222c has been formed.

Next, a deposition material may be supplied into the chamber 1100 by the deposition source 1300 arranged in the chamber 1100. The deposition material may be a gas containing a component serving as a raw material for the opposite electrode 223.

Subsequently, the deposition material may be deposited on the display substrate DS through the mask assembly M arranged to face the deposition source 1300. Thus, the deposition material may be uniformly deposited on the display substrate DS except for a portion of the display substrate DS corresponding to the shield portion SP.

Thus, the opposite electrode 223 having the opposite electrode hole 223H may be formed on the display substrate DS. In this case, the opposite electrode hole 223H may be formed between the first pixel P1 and the second pixel P2.

Next, the component COMP may overlap the opposite electrode hole 223H. Because the opposite electrode 223 is not continuously arranged in the first area A1 in which the component COMP is arranged, the transmittance of light entering or exiting the component COMP may be improved.

In addition, in substantially the same manner as above, the deposition material may be changed to form the first functional layer hole 222aH, the second functional layer hole 222cH, the capping layer hole 224H, and the light extraction layer hole 225H.

Unlike the exemplary embodiments, when the shield portion SP is fixed by a rib or the like extending in the opening OP of the second mask M2, there may be a region in which a deposition material is not deposited on the display substrate DS due to the rib. In this case, because the deposition material has to be re-deposited, by using a mask assembly different from the mask assembly M, on the region in which the deposition material is not deposited due to the rib, the process time for depositing the deposition material on the display substrate DS may increase. In the exemplary embodiments, the mesh portion MP may be provided and the shield portion SP may be fixed to the mesh portion MP. Thus, the opposite electrode 223 and the like may be uniformly deposited on the display substrate DS through a single deposition process, and the efficiency of the method of manufacturing a display device may be improved.

Apparatus for manufacturing a display device according to the principles and some of the exemplary embodiments of the invention include a second mask including a mesh portion having a mesh shape and a shield portion shielding a portion of the mesh portion, and a substrate supporter separating a display substrate from the second mask. In this manner, the apparatus may produce a display device having high transmittance in a transmission area. In addition, according to some exemplary embodiments, the efficiency of the apparatus for manufacturing a display device and the efficiency of the method of manufacturing a display device may be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An apparatus for manufacturing a display device, the apparatus comprising: a mask assembly,
wherein the mask assembly includes:
a mask frame including an open area;
a first mask disposed on the mask frame, the first mask including at least one opening;
a second mask disposed on the first mask, the second mask including a mesh portion having a mesh shape and a blocking member to shield a portion of the mesh portion; and
a first support supporting a display substrate on the second mask and separating the display substrate from the second mask,
wherein the blocking member overlaps the opening,
wherein the mask frame has a thickness greater than a thickness of the first mask or a thickness of the second mask, and
wherein the first support couples the second mask to the mask frame.

2. The apparatus of claim 1, wherein the first support, the second mask, and the mask frame are coupled to one another.

3. The apparatus of claim 2, wherein the first support comprises a substrate supporter at least partially directly coupled to the mask frame.

4. The apparatus of claim 1, wherein the first support is disposed along the mask frame.

5. The apparatus of claim 1, wherein the first support comprises a first substrate supporter and a second substrate supporter,
wherein the first substrate supporter is spaced apart from the open area and is disposed along the mask frame, and
the second substrate supporter intersects the open area.

6. The apparatus of claim 1, wherein the blocking member comprises a shield portion having a generally circular shape in a plan view.

7. The apparatus of claim 1, further comprising:
a chamber in which the mask assembly is arranged; and
a deposition source arranged in the chamber, the deposition source configured to supply a deposition material into the chamber,
wherein the mask assembly is oriented to face the deposition source for deposition material to pass thorough the mask assembly to the display substrate.

8. An apparatus for manufacturing a display device, the apparatus comprising: a mask assembly,
wherein the mask assembly includes:
a mask frame including an open area;
a first mask disposed on the mask frame, the first mask including at least one opening;
a second mask disposed on the first mask, the second mask including a mesh portion having a mesh shape and a blocking member to shield a portion of the mesh portion; and
a first support supporting a display substrate on the second mask and separating the display substrate from the second mask,
wherein the blocking member overlaps the opening,
wherein the mesh portion includes a plurality of first wires extending in a first direction and a plurality of second wires extending in a second direction intersecting the first direction,
wherein the plurality of first wires and the plurality of second wires define a plurality of mesh holes, and
wherein the blocking member entirely shields at least one of the plurality of mesh holes.

* * * * *